United States Patent [19]
Liu

[11] Patent Number: 6,121,124
[45] Date of Patent: Sep. 19, 2000

[54] PROCESS FOR FABRICATING INTEGRATED CIRCUITS WITH DUAL GATE DEVICES THEREIN

[75] Inventor: Chun-Ting Liu, Berkeley Heights, N.J.

[73] Assignee: Lucent Technologies Inc., Murray Hill, N.J.

[21] Appl. No.: 09/099,715

[22] Filed: Jun. 18, 1998

[51] Int. Cl.[7] .................. H01L 21/8238; H01L 21/4763; H01L 21/44

[52] U.S. Cl. .......................... 438/587; 438/655; 438/659; 438/664; 438/592; 438/232; 438/217; 438/199

[58] Field of Search ..................................... 438/199, 207, 438/217, 229, 232, 655, 659–660, 663–664, 587, 592

[56] References Cited

U.S. PATENT DOCUMENTS

| | | | |
|---|---|---|---|
| 4,420,872 | 12/1983 | Solo de Zaldivar | 29/571 |
| 4,716,126 | 12/1987 | Cogan et al. | 437/24 |
| 5,516,713 | 5/1996 | Hsue et al. | 437/43 |
| 5,596,218 | 1/1997 | Soleimani et al. | 257/369 |
| 5,605,848 | 2/1997 | Ngaoaram | 437/24 |
| 5,851,922 | 12/1998 | Bevk et al. | 438/655 |

OTHER PUBLICATIONS

"0.25 0.25 βm W–Polycide Dual Gate and Buried Metal on Diffusion Layer (BMD) Technology" by Tsukamoto, M. et al., 1997 Symposium on VLSI Technology Digest of Technical Papers, pp. 23–24 (Jan. 1997).

"Low Threshold Voltage CMOS Devcies wit Smooth Topography for 1 Volt Applications", by Yu, et al., *IEEE*, pp. 489–492 (Dec. 11–14, 1997).

"Polycide Dual–Gate Structure for Sub–1/4 Micron Low–Voltage CMOS Technology", by Bevk, J. et al., *IEEE*, pp. 893–896 (Dec. 10–13, 1995).

*Primary Examiner*—Charles Bowers
*Assistant Examiner*—Thanh Nguyen
*Attorney, Agent, or Firm*—Richard J. Botos

[57] ABSTRACT

The invention is directed to a process for forming p+ and n+ gates on a single substrate. A polycrystalline silicon or amorphous silicon layer is formed on a substrate with n-type and p-type regions formed therein and with a layer of silicon dioxide formed thereover and the structure is subjected hobo a low temperature anneal. A layer of metal silicide is then formed over the structure and n-type and p-type dopants are implanted into the resulting structure. A nitrogen implant is selectively performed in the portion of the metal silicide layer overlying a field oxide region that separates the n-type region from the p-type region in the substrate surface. The nitrogen implant reduces the amount to which the p-type dopant diffuses through the silicide layer and into the n+ gates. A dielectric material is then formed over the structure and patterned, after which the structure is subjected to additional processing steps to form gate stacks over the n-regions and the p-regions of the substrate.

12 Claims, 1 Drawing Sheet

PROCESS FOR FABRICATING INTEGRATED CIRCUITS WITH DUAL GATE DEVICES THEREIN

BACKGROUND OF THE INVENTION

TECHNICAL FIELD

This invention relates to a process for fabricating integrated circuits.

TECHNICAL BACKGROUND

Many CMOS (Complimentary Metal Oxide Semiconductor) integrated circuits contain both PMOS (p-channel) and NMOS (n-channel) devices. In some integrated circuits the gates of both the PMOS and NMOS devices contain a layer of material (typically polysilicon or a metal silicide) doped with an n-type dopant (referred to hereinafter as n+ gates). However, as gate lengths shrink (because of the need to increase the number of devices formed on a single wafer) and operating voltages decrease below 2.5V (e.g., in low-power devices for portable electronics), there is an increasing trend to the use of p+ gates for PMOS devices. P+ gate PMOS transistors (i.e., surface channel devices) exhibit good short channel performance, threshold voltages, and subthreshold swings which are less dependent upon channel length than PMOS devices with n+ gates (i.e., buried channel devices). Integrated circuits with both n+ gates and p+ gates are referred to herein as dual gate devices.

As the size of individual devices decrease, the spacing between NMOS and PMOS devices is also decreasing. One of the problems that inhibits the ability to form dual gate NMOS and PMOS devices closer together is the lateral diffusion of the p-type dopant from the PMOS region of the doped layer to the NMOS region of the doped layer.

For example, p+ gates are formed by forming a layer of tungsten silicide over a layer of polycrystalline silicon (polysilicon) formed on a silicon substrate. The tungsten silicide layer is then subsequently doped. The tungsten silicide for the p+ gate is typically doped with boron or $BF_2$. However, these dopants diffuse rapidly in the tungsten silicide layer. As the PMOS and NMOS devices get closer together, more of the dopant in the region of the tungsten silicide layer used to form the p+ gate of the PMOS device will diffuse into the region of the tungsten silicide layer used to form the n+ gate of the NMOS device. Such diffusion is undesirable because the diffusion of p-type dopants into the portion of the tungsten silicide layer used in the n+ gate will adversely affect device performance.

One proposed solution to this lateral diffusion of dopants is the removal of a portion of the tungsten silicide layer (and the corresponding portion of the underlying polysilicon layer) between the portion of the layer incorporated into the p+ gate and the portion incorporated into the n+ gate. See Yu, D.C.H., et al., "Novel n+/p+ Dual-Gate Surface-Channel CMOS Device Fabrication and Characterization," 1994 IEDM Technical Digest, page 489 (1994). In Yu et al., a layer of titanium nitride is formed over the tungsten silicide layer to shunt the two gates. Although the titanium nitride shunt layer prevents the lateral diffusion of dopant in the tungsten layer, the process of forming the shunt layer actually increases the distance between the NMOS and the PMOS device.

Another solution to the suppression of lateral diffusion in doped silicide layers from which dual gate device are formed is described in Bevk. J. et al., "W-polycide Dual-gate Structure for Sub-1/4 micron Low-Voltage CMOS Technology," *IEDM*. 95, pp. 893–896. In that process CMOS devices are fabricated by forming a layer of amorphous or polycrystalline silicon (polysilicon hereinafter) over a thin (e.g. 100 Å or less) gate oxide layer which has been previously formed over n and p regions of a semiconductor substrate.

A layer of a refractory metal silicide is then formed over the polysilicon. A mask is formed over the metal silicide layer using standard lithographic techniques to selectively expose portions of the metal silicide layer overlying the p-type regions of the substrate. An n-type dopant is implanted into the exposed portions of the metal silicide layer using standard implant energy and standard dopant concentrations. Arsenic and phosphorus are examples of suitable n-type dopants. The exposed portions of the metal silicide layer are then subjected to a nitrogen implant. A nitrogen dose of at least about $5 \times 10^{14}$ atoms/cm² is introduced into the exposed portions of the metal silicide layer. The mask is then removed and a second mask is formed over the metal silicide layer. Portions of the metal silicide layer overlying the n-type region of the substrate are then exposed through a portion or portions of the mask. A p-type dopant (e.g. B or $BF_2$) is then introduced into the exposed portions of the metal silicide layer.

However, in the Bevk et al. process, nitrogen is implanted in the regions of the tungsten silicide layer that overlie the channel and thin gate oxide areas of the device. Accordingly, the nitrogen implant energy must be controlled to avoid damaging these areas of the device. Because of this limitation, sufficient nitrogen is not introduced into the underlying polysilicon layer to significantly suppress the lateral diffusion in this layer. As the NMOS and PMOS devices get closer together, the amount of dopant that diffuses from the PMOS region to the NMOS region in the polysilicon layer will adversely affect device performance. Furthermore, because the nitrogen does suppress dopant diffusion, the diffusion of dopants to the interface between the polysilicon layer and the underlying silicon substrate is adversely affected. If insufficient dopant reaches the interface between the polysilicon and the underlying silicon substrate (referred to as poly depletion), device performance is also adversely affected.

The problem of poly depletion was addressed in Tsukamoto, M., at al., "0.25 μm W-Polycide Dual Gate and Buried Metal on Diffusion Layer (BMD) Technology for DRAM-Embedded Logic Devices," 1997 *Symposium on VLSI Technology Digest of Technical Papers*, pp. 23–24 (1997). In the Tsukamoto et al. process, a chemical oxide layer is grown between the tungsten silicide and polysilicon layers to stop dopant from diffusing from the polysilicon layer into the tungsten silicide layer. The grain size of the crystals in the polysilicon are also enlarged to suppress the diffusion of dopant in the polysilicon layer. However, the thickness of the chemical oxide is difficult to control. Furthermore, the presence of the chemical oxide layer further complicates gate etching because the etch through the chemical oxide layer is difficult to control. Also, as the space between the NMOS and PMOS shrinks, the diffusion of the dopant in the polysilicon layer is sufficient to cause the lateral diffusion problem.

Accordingly, a process for fabricating integrated circuits with dual gates thereon that adequately suppresses the lateral diffusion of dopants as design rules continue to shrink is desired.

SUMMARY OF THE INVENTION

In the process of the present invention, CMOS devices are fabricated by forming a layer of amorphous or polycrystalline silicon (polysilicon hereinafter) over a thin (e.g. 100 Å or less) gate oxide layer which has been previously formed over n and p regions of a semiconductor substrate. Typically the substrate is a silicon substrate. An isolation field oxide region is formed at the surface of the silicon substrate at the border of the n-type region and p-type region. The isolation field oxide region extends partially into both regions.

A layer of a refractory metal silicide is then formed over the polysilicon. A mask is formed over the metal silicide layer using standard lithographic techniques to selectively expose a portion of the metal silicide layer overlying the isolation field oxide that separates an n-type region of the substrate in which a PMOS device is to be formed from a p-type region of a device in which an NMOS device is to be formed. The masked substrate is then subjected to a nitrogen implant with a dose in the range of about $5 \times 10^{14}$ cm$^{-2}$ to about $5 \times 10^{15}$ cm$^{-2}$. It is advantageous if the dose is in the range of about $1 \times 10^{15}$ cm$^{-2}$ to about $5 \times 10^{15}$ cm$^{-2}$. The energy for the implant is selected to target the nitrogen with the metal silicide and polysilicon layers. Because the only portion of the metal silicide layer that is exposed to through the mask is the portion overlying the isolation field oxide regions that will separate an NMOS device from a PMOS device, nitrogen is only implanted into that exposed portion of the metal silicide layer.

After nitrogen has been implanted into the portion of the metal silicide layer overlying the isolation field oxide region (and the corresponding portion of the underlying polysilicon layer) the mask is removed. Using standard lithographic techniques, an n-type dopant is implanted into exposed portions of the metal silicide layer that will be incorporated into the NMOS devices. Standard implant energy and standard dopant concentrations are used for this implant. Arsenic and phosphorous are examples of suitable n-type dopants. The dose of n-type dopant is largely a matter of design choice and depends upon considerations such as the thickness of the formed polysilicon layer, i.e. lower doses within the range specified herein are used for thinner polysilicon layers within the range of thicknesses specified herein, and other parameters that affect device performance. Generally, the dosage of n-type dopant is in the range of about $1 \times 10^{15}$/cm$^2$ to about $5 \times 10^{15}$/cm$^2$. The mask is then removed, again using standard processing techniques, and a second mask is formed over the metal silicide layer. Portions of the metal silicide layer overlying the n-type region of the substrate (i.e. those portions of the metal silicide layer that will be incorporated into the PMOS device) are then exposed through a portion or portions of the mask. A p-type dopant (e.g. B or BF$_2$) is then introduced into the exposed portions of the metal silicide layer.

Devices are then formed on the wafer using conventional processing techniques that are well known to one skilled in the art.

DETAILED DESCRIPTION

Figure 1:
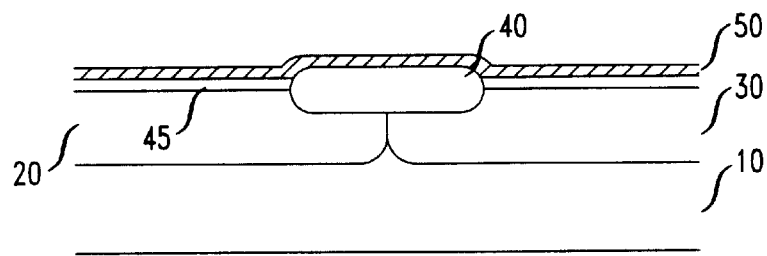
FIGS. 1–4 are cross-sectional views used to illustrate the processing sequence of the present invention.

The process of the present invention is illustrated in FIG. 1A through 1D. CMOS devices are fabricated by forming p-regions 20 and n-regions 30 in a semiconductor substrate 10. Typically the substrate 10 is a silicon substrate. The n-type and p-type regions of the substrate are formed using standard processing techniques well known to one skilled in the art such as the twin tub process described in U.S. Pat. No. 4,435,896 to Parillo et al., which is hereby incorporated by reference.

Field oxide 40 isolates the n-type region 30 and the p-type region 20 at the surface of the substrate 10. The field oxide 40 is formed on the substrate using standard techniques such as furnace oxidation that are well known to one skilled in the art. Typically, the field oxide has a thickness of about 2000 Å to about 4000 Å. After the formation of the field oxide 40, a thin gate oxide layer 45 is formed over exposed portions of the silicon substrate 10. It is advantageous if the thin gate oxide layer is at least 20 Å thick. The thin gate oxide layer 45 is formed using standard processing techniques.

A layer of amorphous silicon or polysilicon 50 is then formed over the substrate surface. Typically, the layer 50 has a thickness of about 20 nm to about 300 nm. It is advantageous if the polysilicon layer has a thickness of about 50 nm to about 100 nm. The minimum thickness is specified to provide film uniformity and to meet the patterning requirements for forming gate stacks. Conditions for forming amorphous silicon or polysilicon on oxidized silicon substrates are well known to one skilled in the art. For example, polycrystalline silicon is formed by low pressure chemical vapor deposition using a gas mixture of ammonia and silane. The polycrystalline silicon is deposited at a temperature greater than 550° C. and typically in the range of about 600° C. to about 650°C.

As illustrated in FIG. 1B, a layer of a refractory metal silicide 60 is then formed over the polysilicon. Examples of suitable metal silicide materials include tungsten silicide, tantalum silicide, and cobalt silicide. The metal silicide is typically formed by sputtering at a temperature in the range of about room temperature to about 400°C. The sputtering process produces a comparatively amorphous layer which does not exhibit crystalline grains which can promote channeling of later-implanted dopants. Generally, the metal silicide layer 60 has a thickness in the range of about 300 Å to about 3000 Å. It is advantageous if the thickness of layer 60 is about 1000 Å to about 2000 Å because of the conductance provided by layers with thicknesses within this range. Other conventional expedients such as chemical vapor deposition (CVD) are also contemplated as suitable for forming the metal silicide layer.

A mask 70 is formed over the metal silicide layer 60 using standard lithographic techniques to selectively expose the portion of the metal silicide layer 60 overlying the field oxide 40 of the substrate 10. The width of the exposed portion of the metal silicide layer 60 is controlled so that the portions of the metal silicide layer that overly the thin gate oxide 45 or the n-region and p-region of the substrate that will become the channel region of the NMOS and PMOS devices are not exposed through the mask. The process of the present invention is advantageous because it allows the PMOS and NMOS devices to be a distance apart that is compatible with the design rules for the integrated circuit. That is, the minimum distance between the NMOS region and the PMOS region is limited by lithography and not by the diffusion of p-type dopants from the PMOS region to the NMOS region.

Figure 2:
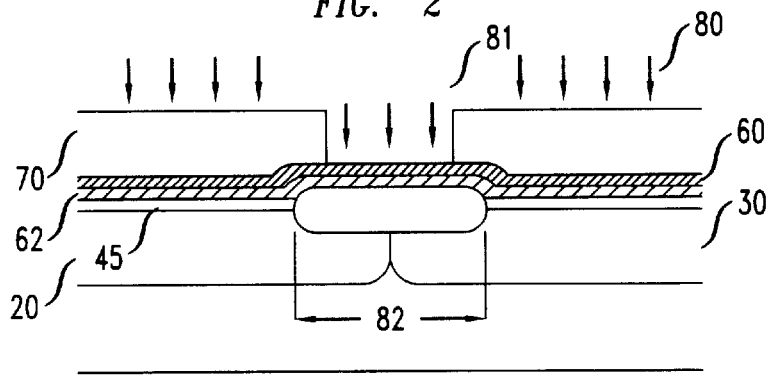
Figure 3:
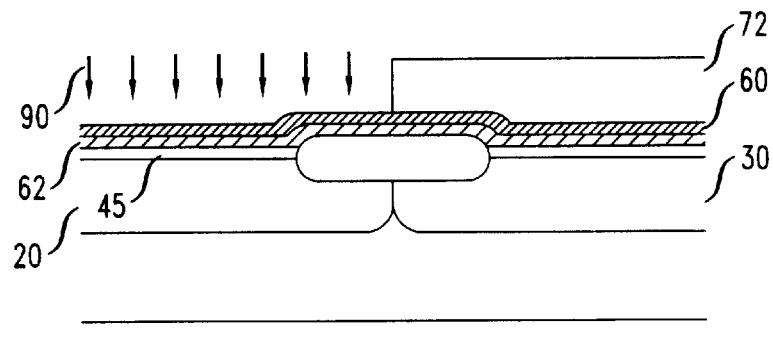
Figure 4:
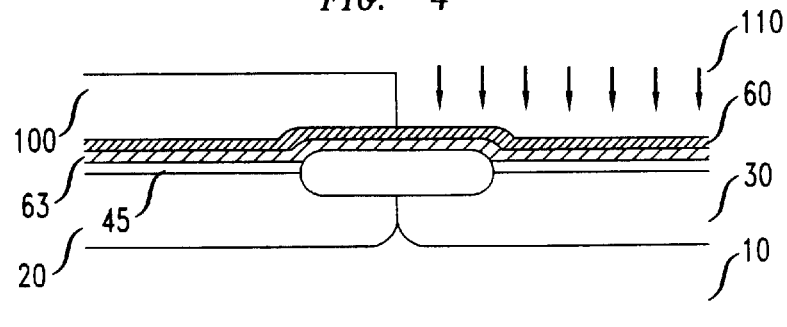

For example, referring to FIG. 2B, if the design rules (i.e. the minimum feature size) for the integrated circuit is 0.18 μm, the width of the window 81 in the mask used for the selective nitrogen implant is 0.18 μm plus two times the lithography nesting tolerance in that technology. If the lithography nesting tolerance were zero, then the spacing between the NMOS 30 and PMOS 20 thin gate oxide area would be 0.18 μm. However, in this example, because the lithography nesting tolerance is 0.06 μm, the spacing 82 between the NMOS 30 and PMOS 20 regions is 0.3 μm.

After the mask 70 is formed, the masked substrate is subjected to a nitrogen implant 80. The implant is not selective because the wafer is masked, and the nitrogen is implanted only in those regions of the substrate exposed through the mask. A nitrogen dopant concentration of at least about $5 \times 10^{14}$ atoms/cm$^2$ is introduced into the exposed portions of the metal silicide layer. The actual dopant concentration is a matter of design choice, but it is advantageous if the dopant concentration is about $1 \times 10^{15}$ atoms/cm$^2$ to about $5 \times 10^{15}$ atoms/cm$^2$.

After the nitrogen implant, the mask 70 is then removed and another mask 72 is formed on the substrate as illustrated in FIG. 2C. An n-type dopant 90 is implanted into the exposed portions 62 of the metal silicide layer 60 using standard implant energy and standard dopant concentrations. Arsenic is one example of a suitable n-type dopant.

The mask 72 is then removed, again using standard techniques for removing photoresist masks, and, as illustrated in FIG. 2D a second mask 100 is formed over the metal silicide layer 60. The portion 63 of the metal silicide layer 60 overlying the n-type region 30 of the substrate 10 is then exposed through a portion or portions of the mask 100. A p-type dopant 110 is then introduced into the exposed portion 63 of the metal silicide layer 60. Typically, the p-type dopant is boron or BF$_2$. The dopant conditions are chosen to confine virtually all of the implant dose in the silicide layer. Exemplary conditions for BF$_2$ implantation are 25 KeV at a dosage of $4 \times 10^{15}$ atoms/cm$^2$. After the boron is implanted, the photoresist 100 is removed using standard processing techniques.

The resulting structure is then subjected to a processing sequence that typically includes the formation of dielectric layer over the silicide layer and other processing steps to form gate stacks over the n-regions and p-regions of the substrate. The dielectric layer is any dielectric material formed at a sufficiently low temperature to prevent cross-diffusion of the dopant through the metal silicide layer. Examples of suitable dielectric layer materials include an oxide layer formed by the plasma-enhanced deposition of TEOS (PETEOS) and a nitride layer formed by plasma-enhanced chemical vapor deposition (PECVD nitride). The dielectric layer can also be a layer of spin-on glass (SOG).

The invention claimed is:

1. A process for device fabrication comprising:

forming a layer of dielectric material on a silicon substrate with n-type and p-type regions therein wherein the n-type and p-type regions are separated by a region of oxidized silicon at the surface of the substrate;

forming a silicon layer of amorphous or polysilicon over the dielectric layer;

forming a refractory metal silicide layer over said amorphous or polysilicon layer;

forming a mask over the refractory metal silicide layer to define a first portion in the refractory metal silicide layer, wherein the first portion is defined as a region that overlies the region of oxidized silicon and wherein the mask is configured so that only the first region is exposed through the mask;

directing a nitrogen dopant at the first portion of the refractory metal silicide layer thereby causing the nitrogen dopant species to implant in the refractory metal silicide;

removing the mask;

directing an n-type dopant species at a second portion of the refractory metal silicide layer thereby causing the n-type dopant species to implant in the silicide;

directing a p-type dopant at a third portion of the refractory metal silicide layer thereby causing the p-type dopant species to implant in the silicide; and performing an anneal at a temperature that is sufficient to cause at least some of both the n-type dopant and the p-type dopant to migrate from the silicide layer to the underlying silicon layer.

2. The process of claim 1 further comprising annealing the substrate after the silicon layer is formed thereon at a temperature not to exceed about 700° C.

3. The process of claim 1 in which the p-type dopant contains boron and is selected from the group consisting of B and BF$_2$.

4. The process of claim 1 wherein the refractory metal silicide is selected from the group consisting of tungsten silicide, tantalum silicide, and cobalt silicide.

5. The process of claim 4 wherein the refractory metal silicide is formed by sputtering.

6. The process of claim 1 wherein the thickness of the silicon layer is about 200 Å to about 3000 Å.

7. The process of claim 2 wherein the substrate is annealed for a time period less than about five hours.

8. The process of claim 1 wherein the n-type dopant is selected from the group consisting of arsenic and phosphorous.

9. The process of claim 1 wherein at least a portion of the dielectric layer overlying the p-type and n-type regions of the substrate has a thickness of about 100 Å or less.

10. The process of claim 6 wherein the thickness of the silicon layer is about 500Å to about 1000 Å.

11. The process of claim 4 wherein the thickness of the metal silicide layer is about 300Å to about 3000 Å.

12. The process of claim 4 wherein the thickness of the metal silicide layer is about 1000Å to about 2000 Å.

* * * * *